(12) United States Patent
Naru et al.

(10) Patent No.: US 10,530,378 B1
(45) Date of Patent: Jan. 7, 2020

(54) SAMPLE BASED GAIN ERROR ESTIMATION FOR ANALOG TO DIGITAL CONVERTER

(71) Applicant: Texas Instruments Incorporated, Dallas, TX (US)

(72) Inventors: Srinivas Kumar Reddy Naru, Bangalore (IN); Nagarajan Viswanathan, Bangalore (IN); Visvesvaraya Pentakota, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/249,927

(22) Filed: Jan. 17, 2019

(51) Int. Cl.
  *H03M 1/06* (2006.01)
(52) U.S. Cl.
  CPC ................... *H03M 1/0612* (2013.01)
(58) Field of Classification Search
  CPC .................................... H03M 1/0612
  USPC .................................. 341/118–155
  See application file for complete search history.

(56) References Cited

U.S. PATENT DOCUMENTS

| | | | |
|---|---|---|---|
| 6,351,227 B1* | 2/2002 | Rudberg | H03M 1/0607 341/118 |
| 9,030,340 B1* | 5/2015 | Waltari | H03M 1/1245 341/118 |
| 9,762,254 B2* | 9/2017 | Venkatraman | H03M 1/1009 |
| 2012/0075132 A1* | 3/2012 | Lai | H03M 3/38 341/143 |
| 2012/0098685 A1* | 4/2012 | Wang | H03M 1/162 341/118 |
| 2012/0098686 A1* | 4/2012 | Wang | H03M 1/508 341/118 |
| 2014/0355697 A1* | 12/2014 | Magin | H04L 1/004 375/257 |
| 2016/0182076 A1* | 6/2016 | El-Chammas | H03M 1/1061 341/121 |

* cited by examiner

*Primary Examiner* — Lam T Mai
(74) *Attorney, Agent, or Firm* — John R. Pessetto; Charles A. Brill; Frank D. Cimino

(57) ABSTRACT

The disclosure provides a circuit. The circuit includes a zone detection block that generates a control signal in response to an input signal. An amplifier generates an amplified signal in response to the input signal and the control signal. An analog to digital converter (ADC) is coupled to the amplifier and samples the amplified signal to generate a digital signal. A digital corrector is coupled to the zone detection block and the ADC, and transforms the digital signal to generate a rectified signal based on the control signal and an error signal. An error estimator is coupled to the zone detection block and receives the rectified signal as a feedback. The error estimator generates the error signal in response to the control signal and the rectified signal.

20 Claims, 3 Drawing Sheets

US 10,530,378 B1

SAMPLE BASED GAIN ERROR ESTIMATION FOR ANALOG TO DIGITAL CONVERTER

TECHNICAL FIELD

The present disclosure is generally related to an analog front end (AFE) circuit, and more particularly to gain and offset error estimation and correction for an amplifier and an analog to digital converter (ADC) in the AFE circuit.

BACKGROUND

Analog systems and digital systems are commonly implemented in an integrated circuit using system on-chip (SOC) technology. Such systems commonly include an analog front end (AFE) circuit. The AFE circuit operates as an interface between an external input terminal, through which analog signals are input, and a digital signal processing unit that processes the received signals in digital format.

The AFE circuit is widely used in various devices, such as down converters for wireless digital communication devices, digital image scanners, digital cameras and voice codecs, and the like. The AFE circuit includes an amplifier and an analog to digital converter (ADC). The amplifier amplifies the received analog input signal, and the ADC converts the amplified analog input signal into digital signal. The amplifier has gain and offset errors across different gain settings. These errors introduce spurs and results in degradation in performance of the ADC.

Also, in real world applications, an analog input signal has high peak to average ratio. As a result, a dynamic range of the ADC is under-utilized. An existing solution is to use a variable gain amplifier in the analog signal chain before the ADC. The variable gain amplifier amplifies the analog input signal when the amplitude is low and keeps the analog input signal intact when the amplitude is high. This allows use of the entire dynamic range of the ADC. However, to reconstruct the signal digitally, the variable gain operation has to be performed digitally. As the gain of the variable gain amplifier is not known accurately and can change with temperature and other variations, the digital compensation can cause analog input signal distortion.

SUMMARY

According to an aspect of the disclosure, a circuit is disclosed. The circuit includes a zone detection block that generates a control signal in response to an input signal. An amplifier generates an amplified signal in response to the input signal and the control signal. An analog to digital converter (ADC) is coupled to the amplifier and samples the amplified signal to generate a digital signal. A digital corrector is coupled to the zone detection block and the ADC, and transforms the digital signal to generate a rectified signal based on the control signal and an error signal. An error estimator is coupled to the zone detection block and receives the rectified signal as a feedback. The error estimator generates the error signal in response to the control signal and the rectified signal.

BRIEF DESCRIPTION OF THE VIEWS OF DRAWINGS

DETAILED DESCRIPTION OF THE EMBODIMENTS

Figure 1:
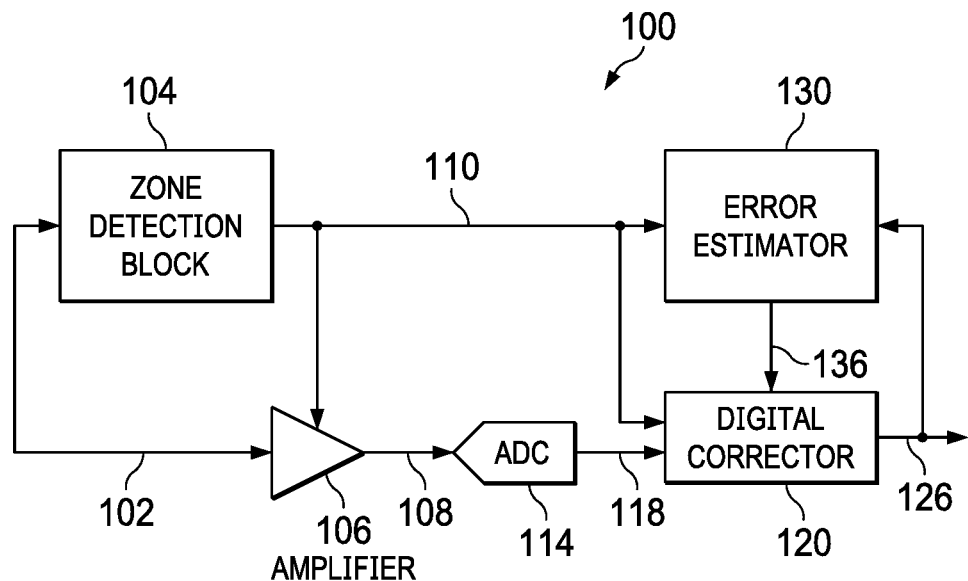
FIG. 1 is a block diagram illustrating a circuit, according to an embodiment.

FIG. 1 is a block diagram illustrating a circuit 100, according to an embodiment. The circuit 100, in one version, is an analog front end (AFE) or part of AFE. The circuit 100 includes a zone detection block 104, an amplifier 106, an analog to digital converter (ADC) 114, a digital corrector 120 and an error estimator 130. The amplifier 106 and the zone detection block 104 receive an input signal 102. The amplifier 106 is coupled to the zone detection block 104. The ADC 114 is coupled to the amplifier 106.

The digital corrector 120 is coupled to the zone detection block 104 and the ADC 114. The error estimator 130 is coupled to the zone detection block 104 and the digital corrector 120. The circuit 100 may include one or more additional components known to those skilled in the relevant art and are not discussed here for simplicity of the description.

The operation of the circuit 100 illustrated in FIG. 1 is explained now. The zone detection block 104 receives the input signal 102 and generates a control signal 110 in response to the input signal 102. The amplifier 106 generates an amplified signal 108 in response to the input signal 102 and the control signal 110. The control signal 110 includes one of a first gain bit and a second gain bit. In one example, the control signal 110 includes one of a set of first gain bits and a set of second gain bits.

The amplifier 106 uses a first gain value when the control signal 110 is equal to the first gain bit and the amplifier 106 uses a second gain value when the control signal 110 is equal to the second gain bit. The amplifier 106 amplifies the input signal 102 using the first gain value when the input signal 102 is above a primary threshold. The amplifier 106 amplifies the input signal 102 using the second gain value when the input signal 102 is below the primary threshold. The amplifier 106 amplifies the input signal 102 using one of the first gain value and the second gain value when the input signal 102 is equal to the primary threshold.

The ADC 114 samples the amplified signal 108 to generate a digital signal 118. The digital corrector 120 transforms the digital signal 118 to generate a rectified signal 126 based on the control signal 110 and an error signal 136. The error estimator 130 receives the rectified signal 126 as a feedback. The error estimator 130 also receives the digital signal 118 from the ADC 114 through the digital corrector 120. The error estimator 130 generates the error signal 136 in response to the control signal 110 and the rectified signal 126.

The input signal 102 includes a positive input signal and a negative input signal. The positive input signal is above a defined threshold and the negative input signal is below the defined threshold. In one example, when the input signal 102 is a sine wave and the defined threshold is 0 volt, then the sine wave above 0 volt is positive input signal and the sine wave below 0 volt is negative input signal.

The error estimator 130 generates a first positive average based on the first gain value, an average of the positive input signal over a defined time and an offset of the amplifier 106. The first positive average ($A_1$) is defined as:

$$A_1 = G_1 S_1 + O_1 \quad (1)$$

where, $G_1$ is the first gain value, $S_1$ is average of the positive input signal over a defined time, and $O_1$ is offset of the amplifier 106 when the first gain value ($G_1$) is used.

The error estimator 130 generates a first negative average based on the first gain value, an average of the negative input signal over the defined time and the offset of the amplifier 106. The first negative average ($B_1$) is defined as:

$$B_1 = G_1 S_2 + O_1 \quad (2)$$

where, $G_1$ is the first gain value, $S_2$ is average of the negative input signal over the defined time, and $O_1$ is the offset of the amplifier 106 when the first gain value ($G_1$) is used.

The error estimator 130 generates a second positive average based on the second gain value, an average of the positive input signal over a defined time and the offset of the amplifier 106. The second positive average ($A_2$) is defined as:

$$A_2 = G_2 S_1 + O_2 \quad (3)$$

where, $G_2$ is the second gain value, $S_1$ is average of the positive input signal over the defined time, and $O_2$ is offset of the amplifier 106 when the second gain value ($G_2$) is used.

The error estimator 130 generates a second negative average based on the second gain value, an average of the negative input signal over the defined time and the offset of the amplifier 106. The first negative average ($B_2$) is defined as:

$$B_2 = G_2 S_2 + O_2 \quad (4)$$

where, $G_2$ is the second gain value, $S_2$ is average of the negative input signal over a defined time, and $O_2$ is the offset of the amplifier 106 when the second gain value ($G_2$) is used.

The error estimator 130 subtracts the first negative average ($B_1$) from the first positive average ($A_1$) to generate a first error ($OE_1$), which is defined as:

$$OE_1 = A_1 - B_1 \quad (5)$$

The error estimator 130 subtracts the second negative average ($B_2$) from the second positive average ($A_2$) to generate a second error ($OE_2$), which is defined as:

$$OE_2 = A_2 - B_2 \quad (6)$$

The error estimator 130 divides the first error by the second error to generate a gain mismatch error (GM), which is defined as:

$$GM = \frac{A_1 - B_1}{A_2 - B_2} \quad (7)$$

Equation 7 is further simplified by using equations 1-4

$$GM = \frac{G_1}{G_2} \quad (8)$$

The error estimator 130 also estimates an offset mismatch error (OM), which is defined as:

$$OM = GM * B_1 - A_1 \quad (9)$$

The error estimator 130 provides the error signal 136 to the digital corrector 120. The error signal 130 includes the first offset error ($OE_1$), the second offset error ($OE_2$) and the gain mismatch error (GM). The digital corrector 120 modifies the digital signal 118 based on the first offset error ($OE_1$), the second offset error ($OE_2$), the gain mismatch error (GM) and the control signal 110. The specifically disclosed operation of circuit 100 through the use of first gain value (G1) and the second gain value (G2) is provided for ease of explanation and is understood not to limit the scope of the present disclosure, and the amplifier 106 can have one or more gain values.

In one version, the digital corrector 120 operates in following mode. When the input signal 102 is above the primary threshold, the digital corrector 120 multiplies the digital signal 118 with unity, and when the input signal 102 is below the primary threshold, the digital corrector 120 multiplies the digital signal 118 with gain mismatch error (GM). When the input signal 102 is equal to the primary threshold, and the amplifier 106 uses first gain value, the digital corrector 120 multiplies the digital signal 118 with unity. Also, when the input signal is equal to the primary threshold, and the amplifier 106 uses second gain value, the digital corrector 120 multiplies the digital signal 118 with gain mismatch error (GM).

In another version, the digital corrector 120 corrects an offset error by operating in following mode. When the input signal 102 is above the primary threshold, the digital corrector 120 subtracts zero from the digital signal 118, and when the input signal 102 is below the primary threshold, the digital corrector 120 subtracts the offset mismatch error (OM) from the digital signal 118. When the input signal 102 is equal to the primary threshold, and the amplifier 106 uses first gain value, the digital corrector 120 subtracts zero from the digital signal 118. Also, when the input signal is equal to the primary threshold, and the amplifier 106 uses second gain value, the digital corrector 120 subtracts the offset mismatch error (OM) from the digital signal 118.

In yet another version, a predefined value of gain mismatch error (GM) is stored in the digital corrector 120. When the input signal 102 is above the primary threshold, the digital corrector 120 multiplies the digital signal 118 with unity, and when the input signal 102 is below the primary threshold, the digital corrector 120 multiplies the digital signal 118 with gain mismatch error (GM). The error estimator 130 generates the error signal only when the input signal 102 is equal to the primary threshold. Thus, the first offset error ($OE_1$), the second offset error ($OE_2$) and the gain mismatch error (GM) are measured by the error estimator 130 only when the input signal 102 is equal to the primary threshold. These values are provided to the digital corrector 120, and the digital corrector 120 uses them on digital signal 118 received subsequently.

The circuit 100 effectively utilizes range of the ADC 114. An effective dynamic range of the ADC 114 is improved because of use of dynamic gain by the amplifier 106. In addition, an absolute gain of the amplifier 106 introduces gain error. The circuit 100 utilizes the gain mismatch error (GM), which is ratio across gain modes, to correct the digital signal 118. Once, the gain mismatch is corrected by the circuit 100, the offset mismatch (OM) is estimated by the circuit 100 using equation 9. A loop of the offset mismatch converges after the gain mismatch has been corrected. In one example, the circuit 100 provides that a loop of the gain mismatch converges irrespective of the loop of the offset mismatch. The circuit 100, in one example, is part of an analog front end (AFE) and continues to calibrate and correct mismatch errors related to gain and offset in the background. The circuit 100, in another example, also tracks variation in the gain mismatch due to process, voltage and temperature variations.

Figure 2:
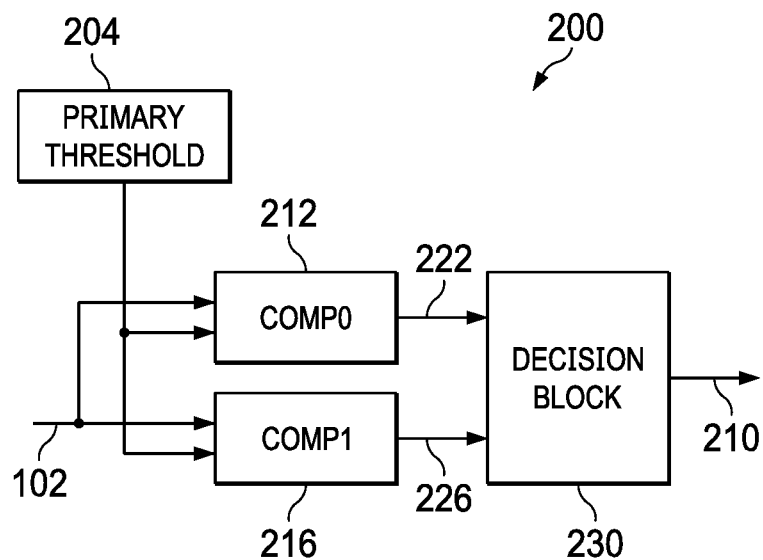
FIG. 2 is a block diagram illustrating a zone detection block, according to an embodiment.

FIG. 2 is a block diagram illustrating a zone detection block 200, according to an embodiment. The zone detection block 200 is analogous, in connection and operation, to the zone detection block 104 illustrated in FIG. 1. The zone detection block 200 includes a first comparator COMP0 212, a second comparator COMP1 216 and a decision block 230. The zone detection block 200 also receives a primary threshold 204. The zone detection block 200 may include one or more additional components known to those skilled in the relevant art and are not discussed here for simplicity of the description.

As illustrated in FIG. 1, the zone detection block 200 receives an input signal 102 in FIG. 2 as well. The first comparator COMP0 212 and the second comparator COMP1 216 receive the input signal 102. The first comparator COMP0 212 and the second comparator COMP1 216 also receive the primary threshold 204. The first comparator COMP0 212 compares the input signal 102 and the primary threshold 204 to generate a first signal 222. The second comparator COMP1 216 compares the input signal 102 and the primary threshold 204 to generate a second signal 226. The decision block 230 generates a control signal 210 in response to the first signal 222 and the second signal 226. The control signal 210 is analogous to the control signal 110 discussed with reference to FIG. 1.

Also, as discussed with reference to FIG. 1, the control signal 210 also includes one of a first gain bit and a second gain bit. The control signal 210 is equal to a first gain bit when the first signal 222 and the second signal 226 are equal to an ancillary bit. The control signal 210 is equal to a second gain bit when the first signal 222 and the second signal 226 are equal to an inverse ancillary bit. The control signal 210 is equal to one of the first gain bit and the second gain bit when the first signal 222 is not equal to the second signal 226. A random mismatch between the first comparator COMP0 212 and the second comparator COMP1 216 and the thermal noise of these comparators results in nonequality of the first signal 222 and the second signal 226, when the input signal 102 is equal or close to the primary threshold 204

In one example, ancillary bit is 0 and the inverse ancillary bit is 1. In another example, the first gain bit is greater than the second gain bit. Thus, when the first signal 222 and the second signal 226 are equal 0, the first gain bit is selected, and when the first signal 222 and the second signal 226 are equal to 1, the second gain bit is selected. When the first signal 222 is 0 and the second signal 226 is 1 or vice versa, then one of the first gain bit and the second gain bit is selected.

The input signal 102 includes a positive input signal and a negative input signal. The positive input signal is above a defined threshold and the negative input signal is below the defined threshold. In one example, when the input signal 102 is a sine wave and the defined threshold is 0 volt, then the sine wave above 0 volt is positive input signal and the sine wave below 0 volt is negative input signal. The decision block 230 operates in the same manner as discussed above both for the positive input signal and the negative input signal.

The use of two comparators, the first comparator COMP0 212 and the second comparator COMP1 216, using the same primary threshold allows for improved use of dynamic gain of the amplifier 106 coupled to the zone detection block 200.

Figure 3:
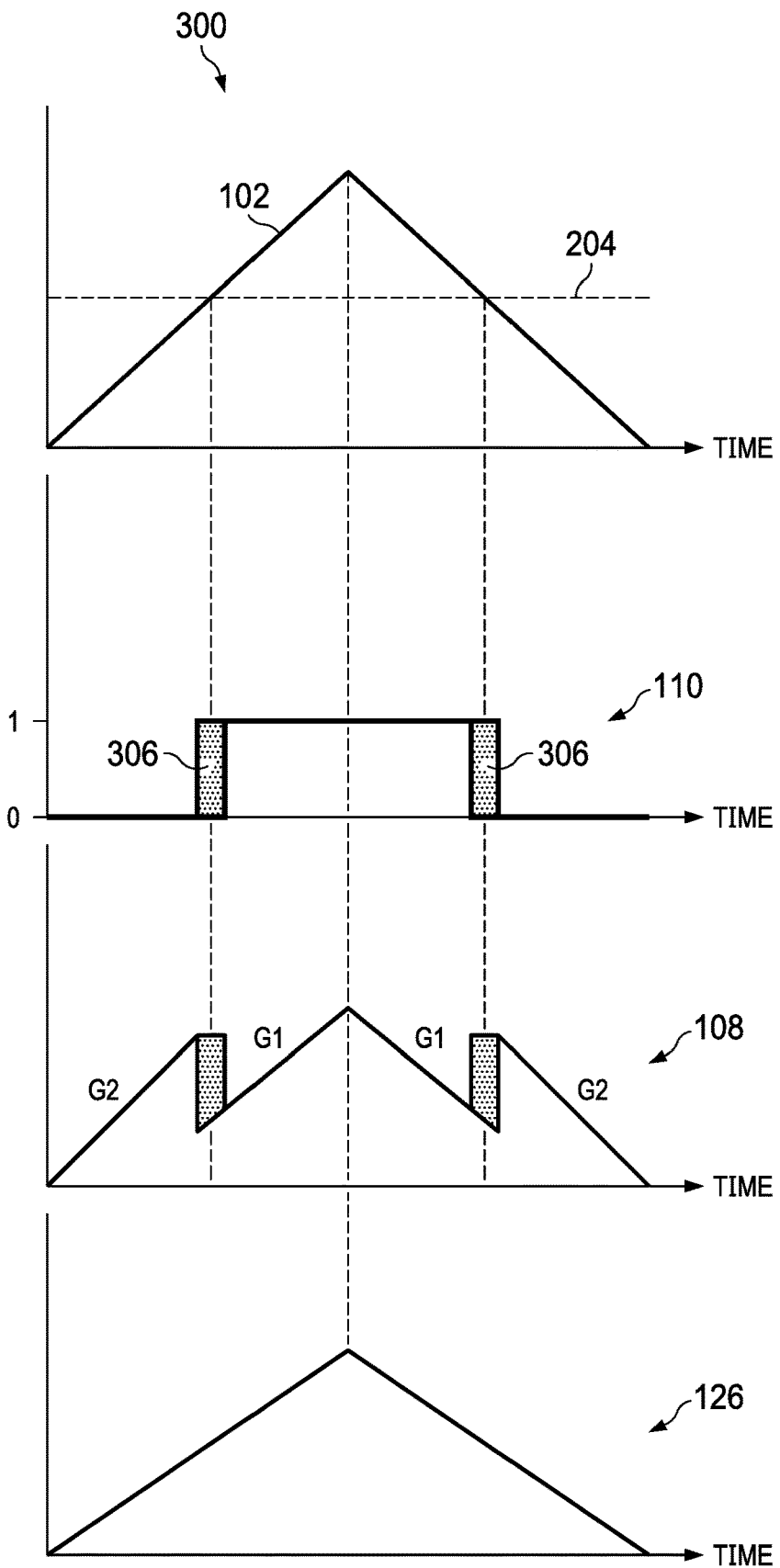
FIG. 3 is a timing diagram illustrating operation of the circuit of FIG. 1, according to an embodiment.

FIG. 3 is a timing diagram 300 illustrating operation of the circuit of FIG. 1, according to an embodiment. The input signal 102, as an example, is illustrated as a triangular waveform and is understood not to limit the scope of the present disclosure. The primary threshold 204 is similar to as illustrated in FIG. 2. The control signal 110 is generated by the zone detection block 104. Zones 306 in the control signal 110 represent regions when the input signal 102 is equal to the primary threshold 204, and hence represents noise. In zone 306, the input signal 102 is close to the primary threshold 204, and hence the zone detection block 104 is unable to decide if the input signal 102 is greater or less than the primary threshold 204 resulting in noise.

In zone 306, the control signal 110 generated by the zone detection block 104 is equal to one of the first gain bit and the second gain bit. The amplifier 106 uses a first gain value (G1) when the control signal 110 is equal to the first gain bit and the amplifier 106 uses a second gain value (G2) when the control signal 110 is equal to the second gain bit. The amplified signal 108 is generated by the amplifier 106. The amplifier 106 amplifies the input signal 102 using the first gain value (G1) when the input signal 102 is above the primary threshold 204. The amplifier 106 amplifies the input signal 102 using the second gain value (G2) when the input signal 102 is below the primary threshold 204. The amplifier 106 amplifies the input signal 102 using one of the first gain value (G1) and the second gain value (G2) when the input signal 102 is equal to the primary threshold 204.

The rectified signal 126 is generated by digital corrector 120. The circuit 100 is able to recreate the input signal 102 and generate it as rectified signal 126. The digital corrector 120 modifies the digital signal 118 based on the first offset error ($OE_1$), the second offset error ($OE_2$), the gain mismatch error (GM) and the control signal 110. The circuit 100 utilizes the gain mismatch error (GM), which is ratio across gain modes, to correct the digital signal 118. Once, the gain mismatch is corrected by the circuit 100, the offset mismatch (OM) is estimated by the circuit 100. A loop of the offset mismatch converges after the gain mismatch has been corrected. The circuit 100, in one example, continuously calibrates and corrects mismatch errors related to gain and offset in the background.

Figure 4:
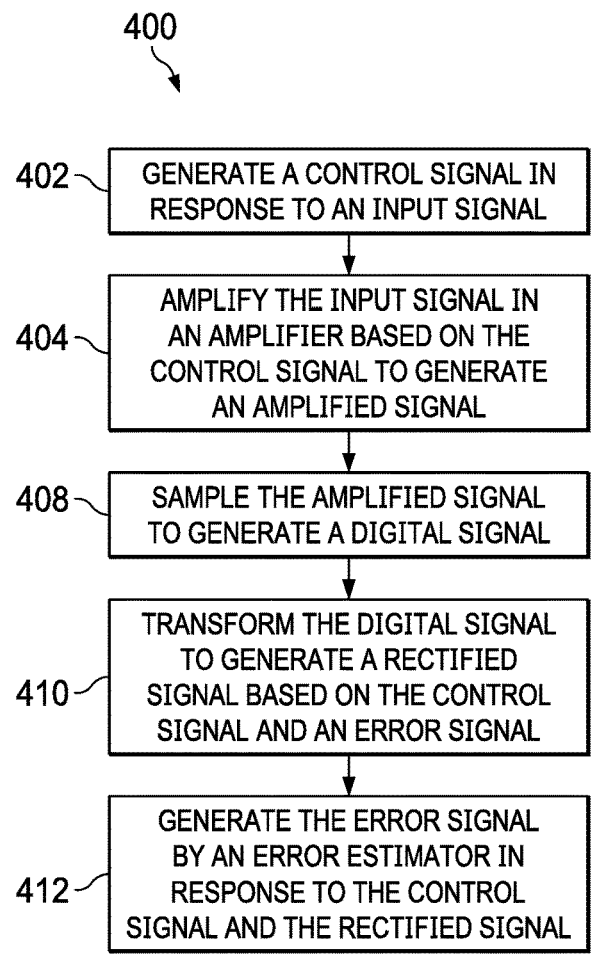
FIG. 4 is a flowchart to illustrate a method of operation of a circuit, according to an embodiment.

FIG. 4 is a flowchart 400 to illustrate a method of operation of a circuit, according to an embodiment. The flowchart 400 is explained in connection with the circuit 100 illustrated in FIG. 1. At step 402, a control signal is generated in response to an input signal. In circuit 100, for example, the zone detection block 104 receives the input signal 102 and generates a control signal 110 in response to the input signal 102. The input signal is amplified in an amplifier to generate an amplified signal based on the control signal, at step 404. In circuit 100, the amplifier 106 generates an amplified signal 108 in response to the input signal 102 and the control signal 110. The control signal 110 includes one of a first gain bit and a second gain bit.

The amplifier 106 uses a first gain value when the control signal 110 is equal to the first gain bit and the amplifier 106 uses a second gain value when the control signal 110 is equal to the second gain bit. The amplifier 106 amplifies the input signal 102 using the first gain value when the input signal 102 is above a primary threshold. The amplifier 106 amplifies the input signal 102 using the second gain value when the input signal 102 is below the primary threshold. The amplifier 106 amplifies the input signal 102 using one of the first gain value and the second gain value when the input signal 102 is equal to the primary threshold.

At step 408, the amplified signal is sampled to generate a digital signal. The ADC 114, in FIG. 1, samples the amplified signal 108 to generate a digital signal 118. The digital signal is transformed to generate a rectified signal based on the control signal and an error signal, at step 410. At step 412, the error signal is generated by an error estimator in response to the control signal and the rectified signal. In circuit 100, the digital corrector 120 transforms the digital signal 118 to generate a rectified signal 126 based on the control signal 110 and an error signal 136. The error estimator 130 receives the rectified signal 126 as a feedback. The error estimator 130 generates the error signal 136 in response to the control signal 110 and the rectified signal 126.

The error estimator 130 provides the error signal 136 to the digital corrector 120. The error signal 130 includes the first offset error ($OE_1$), the second offset error ($OE_2$) and the gain mismatch error (GM). The digital corrector 120 modifies the digital signal 118 based on the first offset error ($OE_1$), the second offset error ($OE_2$), the gain mismatch error (GM) and the control signal 110.

The method illustrated by flowchart 400 improves an effective dynamic range of the ADC 114 because of the use of dynamic gain of the amplifier 106. In addition, an absolute gain of the amplifier 106 introduces gain error. The method utilizes the gain mismatch error (GM), which is ratio across gain modes, to correct the digital signal 118. Once, the gain mismatch is corrected, the offset mismatch is estimated. A loop of the offset mismatch converges after the gain mismatch has been corrected. Since the digital corrector 120 corrects the mismatches across different gain values of the amplifier 106, the rectified signal 126 follows the input signal 102.

Figure 5:
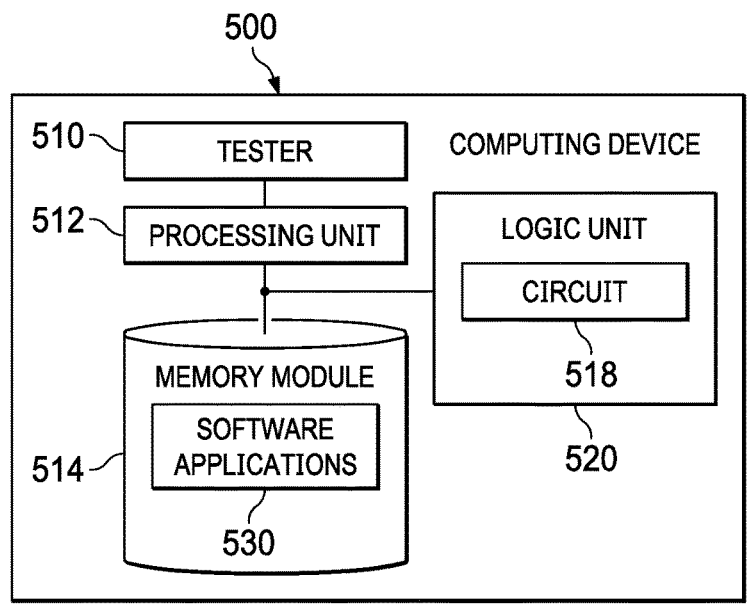
FIG. 5 illustrates a computing device, according to an embodiment.

FIG. 5 illustrates a computing device 500 according to an embodiment. The computing device 500 is, or is incorporated into, a mobile communication device, such as a mobile phone, a personal digital assistant, a personal computer, or any other type of electronic system. The computing device 500 may include one or more additional components known to those skilled in the relevant art and are not discussed here for simplicity of the description.

In some embodiments, the computing device 500 comprises a megacell or a system-on-chip (SoC) which includes a processing unit 512 such as a CPU (Central Processing Unit), a memory module 514 (e.g., random access memory (RAM)) and a tester 510. The processing unit 512 can be, for example, a CISC-type (Complex Instruction Set Computer) CPU, RISC-type CPU (Reduced Instruction Set Computer), or a digital signal processor (DSP).

The memory module 514 (which can be memory such as RAM, flash memory, or disk storage) stores one or more software applications 530 (e.g., embedded applications) that, when executed by the processing unit 512, perform any suitable function associated with the computing device 500. The tester 510 comprises logic that supports testing and debugging of the computing device 500 executing the software application 530.

For example, the tester 510 can be used to emulate a defective or unavailable component(s) of the computing device 500 to allow verification of how the component(s), were it actually present on the computing device 500, would perform in various situations (e.g., how the component(s) would interact with the software application 530). In this way, the software application 530 can be debugged in an environment which resembles post-production operation.

The processing unit 512 typically comprises a memory and logic which store information frequently accessed from the memory module 514. The computing device 500 includes a logic unit 520 coupled to the processing unit 512 and the memory module 514. The logic unit 520 includes a circuit 518. The circuit 518 is analogous to the circuit 100 in connection and operation.

The circuit 518 includes a zone detection block, an amplifier, an analog to digital converter (ADC), a digital corrector and an error estimator. The zone detection block receives the input signal and generates a control signal in response to the input signal. The amplifier generates an amplified signal in response to the input signal and the control signal. The control signal 110 includes one of a first gain bit and a second gain bit.

The amplifier uses a first gain value when the control signal 110 is equal to the first gain bit and the amplifier uses a second gain value when the control signal 110 is equal to the second gain bit. The amplifier amplifies the input signal using the first gain value when the input signal is above a primary threshold. The amplifier amplifies the input signal using the second gain value when the input signal is below the primary threshold. The amplifier amplifies the input signal using one of the first gain value and the second gain value when the input signal is equal to the primary threshold.

The ADC samples the amplified signal to generate a digital signal. The digital corrector transforms the digital signal to generate a rectified signal based on the control signal and an error signal. The error estimator receives the rectified signal as a feedback. The error estimator generates the error signal in response to the control signal and the rectified signal.

The circuit 518 improves an effective dynamic range of the ADC because of the use of dynamic gain of the amplifier. In addition, an absolute gain of the amplifier introduces gain error. The method utilizes the gain mismatch error (GM), which is ratio across gain modes, to correct the digital signal. Once, the gain mismatch is corrected, the offset mismatch is estimated. A loop of the offset mismatch converges after the gain mismatch has been corrected.

Modifications are possible in the described embodiments, and other embodiments are possible, within the scope of the claims.

What is claimed is:

1. A circuit comprising:
   a zone detection block configured to generate a control signal in response to an input signal;
   an amplifier configured to generate an amplified signal in response to the input signal and the control signal;
   an analog to digital converter (ADC) coupled to the amplifier and configured to sample the amplified signal to generate a digital signal;
   a digital corrector coupled to the zone detection block and the ADC, and configured to transform the digital signal to generate a rectified signal based on the control signal and an error signal; and
   an error estimator coupled to the zone detection block and configured to receive the rectified signal as a feedback, the error estimator configured to generate the error signal in response to the control signal and the rectified signal.

2. The circuit of claim 1, wherein the zone detection block further comprises:
   a first comparator configured to compare the input signal and a primary threshold to generate a first signal;
   a second comparator configured to compare the input signal and the primary threshold to generate a second signal; and a decision block configured to generate the control signal in response the first signal and the second signal.

3. The circuit of claim 1, wherein:
the control signal is equal to a first gain bit when the first signal and the second signal are equal to an ancillary bit;
the control signal is equal to a second gain bit when the first signal and the second signal are equal to an inverse ancillary bit; and
the control signal is equal to one of the first gain bit and the second gain bit when the first signal is not equal to the second signal.

4. The circuit of claim 3, wherein the control signal generated by the zone detection block comprises one of the first gain bit and the second gain bit, and wherein the amplifier uses a first gain value when the control signal is equal to the first gain bit and the amplifier uses a second gain value when the control signal is equal to the second gain bit.

5. The circuit of claim 4, wherein the amplifier is configured to:
amplify the input signal using the first gain value when the input signal is above the primary threshold;
amplify the input signal using the second gain value when the input signal is below the primary threshold; and
amplify the input signal using one of the first gain value and the second gain value when the input signal is equal to the primary threshold.

6. The circuit of claim 1, wherein the input signal includes a positive input signal and a negative input signal, the positive input signal is above a defined threshold and the negative input signal is below the defined threshold.

7. The circuit of claim 6, wherein when the input signal is equal to the primary threshold, the error estimator is configured to:
generate a first positive average based on the first gain value, an average of the positive input signal over a defined time and an offset of the amplifier;
generate a first negative average based on the first gain value, an average of the negative input signal over the defined time and the offset of the amplifier;
generate a second positive average based on the second gain value, the average of the positive input signal over a defined time and the offset of the amplifier; and
generate a second negative average based on the second gain value, the average of the negative input signal over the defined time and the offset of the amplifier.

8. The circuit of claim 7, wherein the error estimator is configured to:
subtract the first negative average from the first positive average to generate a first offset error;
subtract the second negative average from the second positive average to generate a second offset error; and
divide the first offset error by the second offset error to generate a gain mismatch error.

9. The circuit of claim 8, wherein the error estimator is configured to provide the error signal to the digital corrector, the error signal includes the first offset error, the second offset error and the gain mismatch error.

10. The circuit of claim 9, wherein the digital corrector is configured to modify the digital signal based on the first offset error, the second offset error, the gain mismatch error and the control signal.

11. A method comprising:
generating a control signal in response to an input signal;
amplifying the input signal in an amplifier based on the control signal to generate an amplified signal;
sampling the amplified signal to generate a digital signal;
transforming the digital signal to generate a rectified signal based on the control signal and an error signal; and
generating the error signal by an error estimator in response to the control signal and the rectified signal.

12. The method of claim 11, wherein generating the control signal further comprises:
comparing the input signal and a primary threshold to generate a first signal;
comparing the input signal and the primary threshold to generate a second signal; and
generating one of a first gain bit and a second gain bit based on the first signal and the second signal.

13. The method of claim 12 further comprising:
generating the first gain bit as the control signal when the first signal and the second signal are equal to an ancillary bit;
generating the second gain bit as the control signal when the first signal and the second signal are equal to an inverse ancillary bit; and
generating one of the first gain bit and the second gain bit as the control signal when the first signal is not equal to the second signal.

14. The method of claim 12 further comprising using a first gain value by the amplifier when the control signal is equal to the first gain bit and using a second gain value by the amplifier when the control signal is equal to the second gain bit.

15. The method of claim 14, wherein amplifying the input signal in the amplifier further comprises:
amplifying the input signal using the first gain value when the input signal is above the primary threshold;
amplifying the input signal using the second gain value when the input signal is below the primary threshold; and
amplifying the input signal using one of the first gain value and the second gain value when the input signal is equal to the primary threshold.

16. The method of claim 11, wherein the input signal includes a positive input signal and a negative input signal, the positive input signal is above a defined threshold and the negative input signal is below the defined threshold.

17. The method of claim 16, wherein generating the error signal by the error estimator when the input signal is equal to the primary threshold further comprises:
generating a first positive average based on the first gain value, an average of the positive input signal over a defined time and an offset of the amplifier;
generating a first negative average based on the first gain value, an average of the negative input signal over the defined time and the offset of the amplifier;
generating a second positive average based on the second gain value, the average of the positive input signal over a defined time and the offset of the amplifier;
generating a second negative average based on the second gain value, the average of the negative input signal over the defined time and the offset of the amplifier;
subtracting the first negative average from the first positive average to generate a first offset error;
subtracting the second negative average from the second positive average to generate a second offset error; and
dividing the first offset error by the second offset error to generate a gain mismatch error.

18. The method of claim 17, wherein:
generating the error signal further comprises generating the first offset error, the second offset error and the gain mismatch error by the error estimator; and transforming the digital signal further comprises modifying the digital signal based on the first offset error, the second offset error, the gain mismatch error and the control signal.

19. A computing device comprising:
a processing unit;
a memory module coupled to the processing unit; and
a logic unit coupled to the processing unit and the memory module, the logic unit comprising a circuit, the circuit comprising:
   a zone detection block configured to generate a control signal in response to an input signal;
   an amplifier configured to generate an amplified signal in response to the input signal and the control signal;
   an analog to digital converter (ADC) coupled to the amplifier and configured to sample the amplified signal to generate a digital signal;
   a digital corrector coupled to the zone detection block and the ADC, and configured to transform the digital signal to generate a rectified signal based on the control signal and an error signal; and
   an error estimator coupled to the zone detection block and configured to receive the rectified signal as a feedback, the error estimator configured to generate the error signal in response to the control signal and the rectified signal.

20. The computing device of claim 19, wherein the zone detection block further comprises:
   a first comparator configured to compare the input signal and a primary threshold to generate a first signal;
   a second comparator configured to compare the input signal and the primary threshold to generate a second signal; and
   a decision block configured to generate the control signal in response the first signal and the second signal.

* * * * *